(12) United States Patent
Dietze et al.

(10) Patent No.: US 10,265,739 B2
(45) Date of Patent: Apr. 23, 2019

(54) METHOD AND APPARATUS FOR TREATING SUBSTRATES

(71) Applicant: SUSS MICROTEC PHOTOMASK EQUIPMENT GMBH & CO. KG, Sternenfels (DE)

(72) Inventors: Uwe Dietze, Austin, TX (US); Peter Dress, Sternenfels (DE); SherJang Singh, Newburgh, NY (US)

(73) Assignee: SUSS MICROTEC PHOTOMASK EQUIPMENT GMBH & CO. KG, Sternenfels (DE)

( * ) Notice: Subject to any disclaimer, the term of this patent is extended or adjusted under 35 U.S.C. 154(b) by 0 days.

(21) Appl. No.: 15/598,361

(22) Filed: May 18, 2017

(65) Prior Publication Data

US 2017/0252781 A1    Sep. 7, 2017

Related U.S. Application Data

(62) Division of application No. 13/505,385, filed as application No. PCT/EP2010/001629 on Mar. 15, 2010, now Pat. No. 9,662,684.
(Continued)

(30) Foreign Application Priority Data

Dec. 18, 2009   (DE) .......................... 10 2009 058 962

(51) Int. Cl.
*H01L 21/67*   (2006.01)
*B08B 3/10*   (2006.01)
(Continued)

(52) U.S. Cl.
CPC .............. *B08B 3/10* (2013.01); *B08B 7/0035* (2013.01); *B08B 7/0057* (2013.01); *G03F 1/82* (2013.01); *H01L 21/67051* (2013.01)

(58) Field of Classification Search
CPC ....... B08B 3/10; B08B 7/0035; B08B 7/0057; G03F 1/82
See application file for complete search history.

(56) References Cited

U.S. PATENT DOCUMENTS 5,236,802 A    8/1993  Jackson
5,814,156 A    9/1998  Elliot et al.
(Continued)

FOREIGN PATENT DOCUMENTS

CN         1653596      8/2005
JP         401228590    9/1989
(Continued)

*Primary Examiner* — Mikhail Kornakov
*Assistant Examiner* — Natasha N Campbell
(74) *Attorney, Agent, or Firm* — Tarolli, Sundheim, Covell & Tummino LLP

(57) ABSTRACT

The application describes several methods and an apparatus for treatment of at least partial areas of a substrate. In said methods, at least one liquid is applied to at least one partial area of the substrate and electromagnetic radiation is introduced into this liquid, in order to achieve a desired effect in accordance with the respective method. In one method, radicals are generated in the liquid by means of UV radiation prior to application of the liquid, wherein generation of the radicals occurs directly before applying the liquid to the substrate, such that at least a portion of the radicals reaches the substrate. In one method, in which ions are removed from at least partial areas of the surface of a substrate and near surface layers of said substrate, a liquid, which is heated above ambient temperature is applied to the substrate, in order to form a liquid film on at least a partial area of said substrate, wherein electromagnetic radiation is introduced into said liquid film such that at least a portion of the radiation reaches the substrate surface. In another method for changing the surface characteristics of a substrate having an at least partially hydrophobic substrate surface such that
(Continued)

at least a portion of said hydrophobic surface gets a hydrophilic surface characteristic, a liquid is applied to at least the partial area of the surface of the substrate, whose surface characteristic is to be changed, and UV radiation of a predetermined range of wavelength is guided through said liquid onto at least the partial area of the surface of said substrate, whose surface characteristic is to be changed. The methods may be performed in a common apparatus in any desired order in series and/or in parallel.

22 Claims, 2 Drawing Sheets

Related U.S. Application Data

(60) Provisional application No. 61/257,633, filed on Nov. 3, 2009.

(51) Int. Cl.
  *B08B 7/00* (2006.01)
  *G03F 1/82* (2012.01)

(56) References Cited

U.S. PATENT DOCUMENTS

| | | |
|---|---|---|
| 6,028,316 A | 2/2000 | Bender |
| 6,431,183 B1 | 8/2002 | Konishi et al. |
| 6,685,890 B1 | 2/2004 | Van Remmen |
| 6,869,487 B1 | 3/2005 | Bergman |
| 2002/0000019 A1 | 1/2002 | Park et al. |
| 2002/0083961 A1 | 7/2002 | Tsuga |
| 2006/0207629 A1 | 9/2006 | Rastegar et al. |
| 2007/0093406 A1 | 4/2007 | Henryson |
| 2008/0113518 A1 | 5/2008 | Kume et al. |

FOREIGN PATENT DOCUMENTS

| | | |
|---|---|---|
| JP | 2008043925 | 2/2008 |
| JP | 2008108997 | 5/2008 |
| NL | 1090589 | 6/2007 |

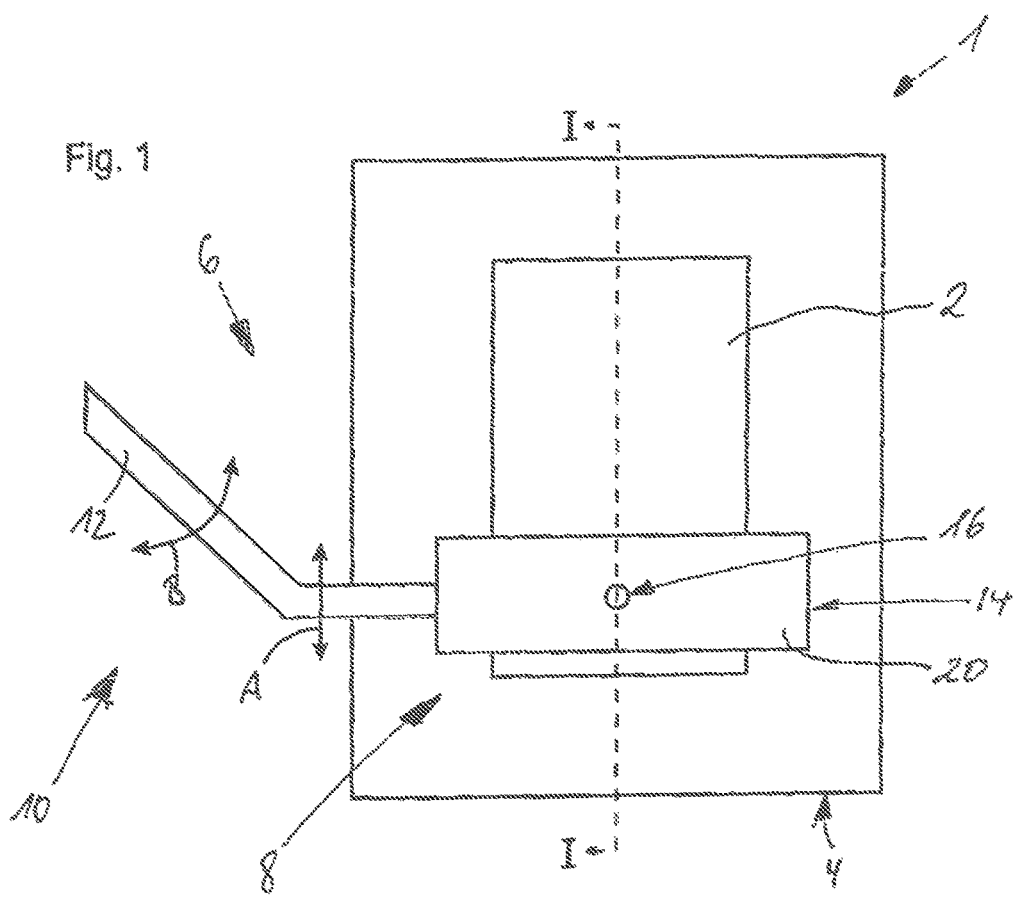
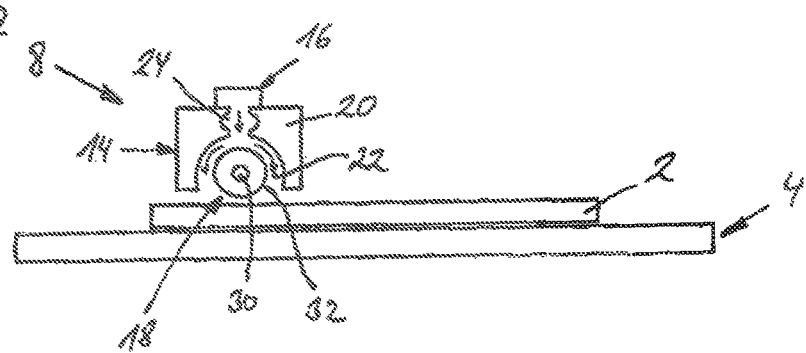

METHOD AND APPARATUS FOR TREATING SUBSTRATES

RELATED APPLICATIONS

This application is a divisional of U.S. application Ser. No. 13/505,385, which issued as U.S. Pat. No. 9,662,684 B2 on May 30, 2017, and which is based on PCT Application Serial No. PCT/EP2010/001629, filed Mar. 15, 2010, which claims priority from U.S. Provisional Application Ser. No. 61/257,633, filed on Nov. 3, 2009 and German Application Serial No. DE 10 2009 058 982.7, filed on Dec. 18, 2009.

DESCRIPTION

The present Invention relates to a method and an apparatus for treating substrates, wherein a liquid is supplied to at least a partial area of the substrate and radiation is introduced into the liquid.

In the field of semiconductors it is known that for example photo masks have to be exposed to different treatment steps, In particular cleaning steps, both during their manufacture and during their use in the field. It is in particular known to expose the masks to a wet cleaning process. For such a wet cleaning process it is advantageous if the surface to be cleaned has hydrophilic surface characteristics, in order to enable better wetting of the surface to be cleaned by the process media applied thereto. Due to different phenomena, the surface of photo masks, however, is often hydrophobic prior to its cleaning, which may on one hand be caused by the orientation of absorbed water molecules and on the other hand by thin organic layers.

Thus it is known in the field to irradiate the masks prior to a wet cleaning thereof with UV radiation, while the mask is in a gas atmosphere such as nitrogen or an oxygen atmosphere. In this process often UV radiation having a wavelength of about 172 nm is used.

Such a UV radiation in a gas atmosphere may initiate several different processes such as an oxidation of hydrocarbons at the surface by atomic oxygen, an oxidation of metals at the surface of the substrate by atomic oxygen, the removal of hydrophilic molecular wet layers by photons, and the activation of adsorbed Ions by UV energy. In particular, a hydrophobic surface area may be changed into a hydrophilic surface area. The photons of the UV radiation, however, often impact unimpeded with high energy on the surface of the substrate. This may feed to stress forces and/or relaxation processes in the substrate, in particular in fine structures on the substrate.

This may thus lead to the displacement of structures, which may negatively influence the usability of the substrate.

It is further known to provide a wet treatment after such a preparation of the surface, in which a liquid film is at least locally formed on the substrate and UV radiation is introduced into the liquid film. In this process, the liquid and the UV radiation are matched such that a majority of the UV radiation is absorbed in the liquid film in order to generate radicals therein. In particular, it is known to generate hydroxyl radicals in for example diluted hydrogen peroxide water or ozone water $O_3$—$H_2O$. Such hydroxyl radicals cause selective dissolution of organic materials from the substrate surface without harming metallic on the substrate surface if they are present.

Such a method is for example disclosed in US 2006/0207629 A1. In particular, a thin liquid film made of for example ozone water, hydrogen peroxide water, ammonia water, a hydrogen peroxide solution, sulfuric acid, organic acids and mixtures thereof is applied. Then, UV radiation is introduced into the liquid film via a window which is transparent to UV radiation and which is in contact with the liquid film, in order to generate radicals. Again the UV radiation source and the liquid film are matched such that many radicals are generated, such that a high absorption rate, if possible a complete absorption, of the UV radiation occurs in the liquid film.

After the removal of the contaminations mentioned above, in particular of organic contaminations, it may be useful to also remove residual ions from the substrate surface. Known methods for this purpose usually use heated liquids, in particular deionized water (DI water) to rinse the surface. Here, the problem may arise that for a complete removal of residual ions either a longer application time of the liquid or a high temperature of the liquid is required. High temperatures may be problematic in that the heating process for the liquid may lead to contaminations therein. This is in particular true when the temperature is raised close to the boiling point of the respective liquid. In the treatment of temperature sensitive substrates or substrate layers it is furthermore possible that the solubility of the Ions is below the desired value. Prolonging application times for compensating for reduced temperatures is not desirable in view of efficiency considerations.

Starting from the known treatment methods it is an object of the present invention to provide an improved apparatus and an improved method for the treatment of substrates. In accordance with one aspect of the invention the generation of a hydrophilic substrate surface should be improved. In accordance with a further aspect the cleaning of the substrate surface should be improved. In accordance with yet another aspect of the invention, the removal of ions from the substrate surface should be improved.

In accordance with the present invention one or more of these aspects may solved by a method according to claim 1, a method according to claim 14, a method according to claims 27, a method according to claim 32, a method according to claim 37 or a device according to claim 42. Further embodiments of the invention are claimed in the respective dependent claims.

In particular, a method for cleaning of a substrate is provided, in which a liquid is applied to at least a partial area of said substrate, wherein prior to applying the liquid to the substrate, radicals are generated therein by means of UV radiation, and wherein the generation of said radicals occurs directly before applying the liquid to the substrate, such that at least a portion of the radicals reaches the substrate. At the same time, by pre-treating the liquid prior to applying the same to the substrate, it may be ensured that unwanted reactive components such as ozone are destroyed or substantially reduced before the liquid reaches the substrate surface.

By generating the radicals directly before applying the liquid to the substrate it can be ensured by a targeted direction of flow of the medium having activated radicals therein, that at least a portion of these radicals reach the substrate and thus an improved cleaning of the substrate surface may be achieved. Preferably, UV radiation may also be introduced into a liquid film on the substrate formed by the activated liquid applied to the substrate and containing the radicals or precursors for radicals, in order to maintain the activation of the radicals and/or to generate further radicals. In so doing, the effective duration of the radicals in the liquid may b(c) prolonged, leading to an improved cleaning of the substrate surface.

The UV radiation, which is introduced into the liquid prior to applying the same to the substrate and which is introduced into the liquid film on said substrate may at least partially be emitted by the same radiation source, thus simplifying the method. For a localized cleaning of surface areas of the substrate it is possible to limit the liquid containing the radicals to selected surface areas of the substrate to be cleaned.

For generating the radicals UV radiation having for example a wavelength in the range of 140 nm to 280 nm, depending on the liquid in the range of 140 nm to 200 nm may be used, which has a high absorption rate in most of the liquids. Preferably, the UV radiation in the cited range of wavelength should be matched to the liquid such that at least 50% of this UV radiation, and in particular 80% thereof is absorbed in the liquid.

In one embodiment UV radiation is introduced into the liquid prior to applying the same to the substrate while the liquid flows along a UV radiation source, wherein on the one hand, the UV radiation is chosen such that it causes a destruction of the molecular structure of the liquid, in order to facilitate the directly subsequent generation of radicals possibly by UV radiation. The liquid is thus prepared for an efficient generation of radicals and undesired reactive components in the liquid are reduced or destroyed prior to the application of the liquid. Thus these components do not contact the substrate surface or do so only in a weaker form. This occurs for example by generating suited precursors and intermediate products while the liquid is in motion, because this dynamics facilitates and homogenizes the respective destruction or decomposition. The direction of flow of the liquid is chosen such that it flows towards the substrate and such that the generation of radicals occurs directly before applying the liquid to the substrate. By choosing a suited UV radiation, a pretreatrnent of the liquid on one hand and the generation of radicals on the other hand may be achieved.

As the liquid is at least one of the following may be used: ozone water, hydrogen water, DI water, $H_2O$, $CO_2$—$H_2O$, DI water having O2 gas dissolved therein, $NH_4OH$, acetic acid, citric add, TMAH, $HNO_3$, HCl, $H_3PO_4$ or mixtures thereof. Furthermore, to as is known in the art, hydrogen peroxide solutions, sulfuric add or other organic acids may be used, wherein the decomposition of the media directly before the generation of the radicals may make superfluous the use of chemicals which require special disposal. The substrate may for example be one of the following: a photo mask for the manufacture of semiconductors, a semiconductor, in particular a Si-wafer, a Ge-wafer, a GaAs-wafer or an InP-wafer, a flat panel substrate and a multi layer ceramic substrate, or any other substrate to be cleaned which may for example be used in the manufacture of semiconductors. Such substrates may have different shapes and sizes. During the cleaning at least one of the following is at least partially removed from the substrate by the help of the radicals: carbon, hydrocarbons, organic contaminations as well as organic functional layers, such as positive resist, negative resist and ion implanted resist, embossing and imprint material, stress buffer and underfill materials, lacquers, dyes, bio materials and also bacteria.

In accordance with a further aspect of the invention, a method for removing ions from the surface of a substrate and near surface layers of said substrate is provided, wherein a liquid which is heated above ambient temperature is applied onto said substrate, in order to form a liquid film on at least a partial area of said substrate, and wherein electromagnetic radiation is introduced into said liquid film such that at least a portion of said radiation reaches the surface of said substrate. The electromagnetic radiation thereby causes increased ion mobility when it hits residual ions on the substrate surface. Furthermore, the electromagnetic radiation may increase the temperature of the liquid and/or may generate radicals therein, when it is absorbed, both of which may facilitate the removal of ions.

In one embodiment, the liquid is heated at least partially by means of electromagnetic radiation immediately prior to and/or during the application thereof onto the substrate, thereby little energy losses occur, before the thus heated liquid reaches the substrate. Alternatively or additionally, the liquid may be delivered pre-heated to the point of use before applying electromagnetic radiation. The liquid may for example be to heated to a temperature in the range between ambient temperature and the boiling point of the liquid. It is also possible to conduct the method under increased pressure and thus heat the liquid to a higher temperature before it reaches the boiling point.

As the liquid one of the following may for example be used: ozone water, hydrogen water, DI water, $H_2O$, $CO_2$—$H_2O$, DI water having $O_2$ gas dissolved therein or mixtures thereof.

In one embodiment UV radiation, in particular UV radiation having a wavelength above 190 nm is introduced into the liquid, at least 50% of which, in particular at least 80% of which reaches the interface between a surface of the substrate and the liquid film. Alternatively or additionally IR radiation may be introduced into the liquid film, which may for example be used for an in-situ heating of the liquid film. In this case at least 50% of the IR radiation should roach the interface between the surface of the substrate and the liquid film. The UV radiation and the IR radiation may be introduced via the same radiation source. At least a portion of the radiation may generate radicals in the liquid film.

According to a further aspect, a method for changing the surface characteristics of a substrate having an at least partially hydrophobic substrate surface is provided, in which at least a portion of said hydrophobic substrate surface gets an hydrophilic surface characteristic. To achieve this, a liquid is applied to at least the partial area of the substrate surface, whose surface characteristic is to be changed and UV radiation of a predetermined range of wavelength is guided through said liquid onto at least the partial area of the surface of said substrate, whose surface characteristic is to be changed. Due to absorption of in particular high energy short wave radiation in the liquid, problems with respect to stress forces in the area of the substrate surface may be substantially reduced or completely overcome. The liquid also facilitates the removal of the hydrophobic surface layer at low radiation energies compared to the dry condition, thus also enabling a further reduction of stress at the substrate surface.

In order to achieve a good transmission through the liquid, the predetermined range wavelengths of the UV radiation is above 190 nm, wherein at least 80% of the UV radiation within said predetermined wavelength range should reach the surface of the substrate. As the liquid at least one of the following may be used: ozone water, hydrogen water, DI water, $CO_2$-water or mixtures thereof. Other liquids may also be used. In particular, DI water may also be used.

The different methods described above, may advantageously combined to a complete method, wherein individual ones of these methods are conducted sequentially and/or in parallel in the same or also changing liquids. In particular, it is possible to conduct these methods in a single apparatus without the need to handle the substrate between the individual methods.

In accordance with another aspect, an apparatus for treating substrates is provided, comprising a substrate holder for receiving the substrate, a housing defining a flow chamber having an inlet and an outlet, a first radiation source, and a unit for generating a relative movement between said substrate holder and said housing. The first radiation source is arranged to emit radiation into said flow chamber and is further capable of emitting UV radiation. The unit for generating the relative movement is capable to arrange said housing with respect to said substrate holder such that the outlet is directed towards the substrate holder such that a liquid exiting the outlet directly flows onto a substrate on the substrate holder.

Such an apparatus enables the introduction of radiation, in particular UV radiation, into a liquid applied to a substrate via the first radiation source. This may for example be used, as described in the above methods, for generating precursors and intermediate products for the generation of radicals or directly for generating radicals in the liquid. It is, however, also possible to heat the liquid during the application thereof onto the substrate.

It is possible that the first radiation source is arranged such that it also emits radiation through said outlet out of the housing. This enables introduction of radiation into the liquid not only prior to the application thereof onto the substrate but also, thereafter, to maintain an activation of radicals or to generate further radicals. Also, further heating of the liquid or maintaining the liquid at a temperature may be achieved. Furthermore, the same radiation source, which is used to introduce radiation into the liquid prior to the application thereof onto a substrate, may also be used in a simple manner to achieve changing a hydrophobic surface to a hydrophilic surface, or for the removal of ions from the substrate surface.

In one embodiment, the first radiation source is at least partially arranged in said flow chamber. The housing may for example have an outlet opening in which the first radiation source may be at least partially arranged in the outlet opening, in particular, substantially in the middle thereof. The outlet opening and the first radiation source may have an extension in length which is greater or at least equal to an extension in width of the substrate to be cleaned, in order to enable a complete cleaning of the substrate during a single scanning movement of the housing relative to the substrate. In one embodiment, the first radiation source comprises a first lamp, which emits radiation in the UV range, wherein the first lamp may additionally emit radiation in the IR range. The first radiation source may additionally comprise at least a second lamp emitting radiation in a primarily different wavelength range than the first lamp. As an example, the second lamp may emit IR radiation, in case the first lamp does not emit IR radiation, or it may for example emit UV radiation in a different range of wavelengths. The radiation source may thus be matched to the requirements of a process by respectively controlling the first and second lamps. It is also possible that the first radiation source has further lamps.

According to one embodiment, a cover is provided between the first and/or second lamp and the flow chamber in the housing, wherein the at least one cover is substantially transparent to at least UV radiation. Such a cover enables replacement of individual lamps without the danger of introducing contaminations into the flow chamber. In this respect, the cover completely surrounds the first and/or second lamp at least in one plane. The material of the cover may for example be quartz.

The first and/or second lamp may be a longitudinal or rod lamp, which may extend through the flow chamber and which may provide homogenous radiation throughout the same. The first lamp may inter alia emit UV radiation in the wavelength range between 140 nm and 280 nm, depending in on the liquid between 140 nm to 200 nm, and in one embodiment primarily, i.e. more than 50% of UV radiation in this wavelength range. The second lamp may for example emit radiation in the wavelength range over 180 nm and/or IR radiation. Hereby different process results may be achieved. The radiation above 180 nm may for example primarily cause a decomposition of certain liquids in the flow chamber, in order to subsequently facilitate a generation of radicals in the flow chamber by the radiation in the range between 140 and 280 nm, depending in on the liquid between 140 nm to 200 nm.

Additionally, at least one second radiation source may be provided outside the flow chamber of the housing such that it emits radiation into an area adjacent to the outlet of the housing. Such a radiation source would not primarily emit radiation into the flow chamber, but, if applicable, into a liquid film formed on a substrate by liquid exiting the flow chamber. The second radiation source may primarily emit radiation in a different wavelength range than the first radiation source, even though it is also contemplated that it emits substantially the same radiation. In particular, the second radiation source may emit UV radiation in the wavelength rang(c) above 180 nm and/or IR radiation.

A control unit may be provided, which is capable of individually and independently controlling the first and second radiation source and possibly of individual lamps thereof. This enables matching the introduction of radiation into the liquid applied to a substrate in accordance with the respective process requirements.

The invention will be explained in more detail herein below with reference to the drawings. In the drawings:

FIG. 1 shows a schematic top view of a treatment apparatus according to the present invention;

FIG. 2 shows a schematic sectional view of the apparatus of FIG. 1 along line i-i;

Figure 3:
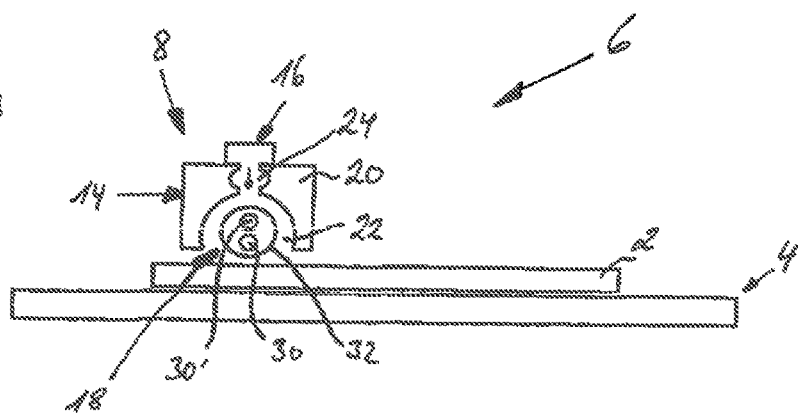
FIG. 3 shows a schematic sectional view similar to FIG. 2 according to an alternative embodiment of the invention.

Any directional references used in the following description, such as above, below, left or right refers to the drawings and is not to be construed as limiting the application, even though it may be a preferred arrangement.

FIG. 1 shows a schematic top view onto an apparatus 1 for treating substrates 2, while FIG. 2 shows a schematic sectional view of the apparatus 1 along the line I-I.

The apparatus 1 basically consists of a receiver for the substrate, which will be called a substrate holder for an application unit 6. The substrate holder 4 and the application unit 6 may be arranged in a pressure chamber, which is not shown, in which a positive pressure or a negative pressure may be generated by appropriate means.

The substrate holder 4 is, as may be seen in the drawings, a flat rectangular plate for receiving the also rectangular substrate 2. The substrate holder 4 may have other shapes, which may be matched to the shape of the substrate 2 to be treated. The to substrate holder 4 has a drainage, which is not shown, for liquids, which may be applied via the application unit 6 onto the substrate 2.

The application unit 6 consists of a main part 8 and a support part 10, which supports the main part 8 in a movable manner, as is shown by the double-headed arrows A is and B. In particular, the support part 10 has a support arm 12, which is connected on one end to the main part 8, and the other end of which is connected to a drive, which is not shown. As is shown by the double-headed arrows A and B, the drive may for example provide a pivotal movement of the support arm 10 and thus the main part 8 and/or a linear movement. In this manner, the main part 8 may be moved across a substrate 2, which is received on said substrate holder 4, in order to enable treatment of partial areas or the complete surface of said substrate. Furthermore, it is also possible that the support arm 10 conducts a lift movement in order to adjust a distance between the main part 8 and the surface of a substrate 2 received on the substrate holder 4.

Alternatively, or additionally it is also possible to provide a moving mechanism for the substrate holder, in order to provide relative movement between the substrate 2 and the main part 8.

The main part 8 consists in substance of a housing 14, a fluid port 16 and a radiation source 18. The housing 14 has an elongated cuboid shaped body 20, which defines in its longitudinal extension a flow chamber 22, which in substance extends across the complete lengths of the body 20. The flow chamber 22 has a length extension, which is larger than a width extension of the substrate 2, in order to be able to apply a liquid to the substrate across the complete width thereof, as will be explained in more detail herein below. It is also possible that the flow chamber has a smaller dimension. The inner surface of the flow chamber 22 is designed to have a high reflectivity in particular with respect to UV radiation, while IR radiation may be substantially absorbed.

The flow chamber 20 has a substantially round cross-sectional shape. The flow chamber 22 is open towards the bottom side of the body 20, such that the body defines an outlet opening directed towards the substrate 2 to be treated. In an upper portion of the flow chamber 22, a conduit 24 is provided in the body 20, which extends in substance parallel to the flow chamber 22. The conduit 24 is fluidly connected to the flow chamber 22 at a plurality of locations, in order to conduct fluids into the flow chamber 22 via the conduit 24. In this respect it is noted that the conduit 24 is capable of conducting fluids into the flow chamber 22 substantially over the complete length thereof. The conduit 24 is also connected to the fluid port 16.

The fluid port 16 is connected to a conduit, not shown, via which one or more fluids may be conducted to the fluid port 16. It is possible, that a plurality of fluids may be simultaneously or sequentially conducted to the fluid port via this conduit. It is also possible to provide a plurality of conduits, via e.g. different fluids may be conducted to the fluid port. As fluids, e.g. liquids may be taken into consideration, but it is also possible to conduct gases to the fluid port, which may e.g. be mixed with a liquid in the fluid port 16 and the conduit 24, before they are conducted to the flow chamber 22. In FIG. 2 arrows are shown, which indicate the flow of a fluid from the fluid port 16 via the conduit 24, into the flow chamber 22 and out of the housing 14.

The radiation source 18 has a longitudinally extending shape and extends along the complete flow chamber 22, substantially in the middle thereof. The radiation source 18 has a rod lamp 30, which is surrounded by a cover 32, which is substantially transparent to the radiation of a lamp 30. The rod lamp is of the type, which emits at least UV radiation in a predetermined range of wave length. It is also possible that the rod lamp 30 emits radiation across a broad spectrum of wave lengths and in particular emits UV radiation and IR radiation.

The cover 32, which may consist for example of quartz glass surrounds the rod lamp 30 completely within the flow chamber 22 and isolates the same with respect to fluids in the flow chamber 22. The cover may for example extend through an end wall of the flow chamber 22 out of the body 20. This would enable access to the rod lamp 30, for example for replacement or maintenance purposes, without having to access the flow chamber 22. Due to its arrangement in the flow chamber 22, the cover 32 forms together with the inner walls of the flow chamber 22 a flow path for fluids conducted into the now chamber z via the conduit 24. Such fluids new around the cover 32 and thus as a whole around the radiation source 18. Radiation emitted by the rod lamp 30 is thus introduced into any fluid flowing along the flow path. Furthermore, the cover 32 extends beyond the bottom surface of the body 20 and thus partially extends into an outlet opening of the body 20. Thus it is possible that radiation emitted from the rod lamp also exits the flow chamber 22 towards the substrate holder 4 or onto a substrate 2 thereon. In particular, the radiation may be introduced into a liquid film on the substrate 2, which is for example formed by a liquid, which flows through the flow chamber 22 onto the substrate.

FIG. 3 shows a schematic side view similar to FIG. 2 of an alternative embodiment of the apparatus 1 for treating substrates 2. When describing this embodiment, the same reference signs are used as previously inasmuch as the same or similar elements are provided.

The apparatus 1 again substantially consists of a substrate holder 4 for receiving a substrate and an application unit 6. The substrate holder may be designed ion the same manner as described before with respect to FIGS. 1 and 2.

The application unit 8 again consists of a main part 8 and a support part, which is not shown in FIG. 3, which may, however, have the same design as previously described with respect to FIGS. 1 and 2. The main part 8 again substantially consists of a housing 14, a fluid port 16 and a radiation source 18, wherein the housing 14 and the fluid port may have the same design as previously described with respect to FIGS. 1 and 2.

The radiation source 18 again has an elongated shape and extends substantially in the middle through the flow chamber 22. The radiation source 18 in this embodiment has rod lamps 30, 30', which are surrounded by a cover 32, which is substantially transparent to the radiation of the rod lamps 30, 30'. The rod lamps 30, 30' are shown above each other in FIG. 3, but they may also be arranged in a different manner within the cover 32. The rod lamps may be of the same or of different types, wherein at least one of them emits UV radiation in a predetermined range of wave length. In particular, it is possible that both rod lamps 30, 30' emit UV radiation in different ranges of wave length. The upper rod lamp 30' may for example at least partially or primarily emit UV radiation in the wave length range above 180 nm, while the lower rod lamp 30 at least partially or primarily emits UV radiation in the wave length range of 140 to 280 nm, depending in on the liquid between 140 nm to 200 nm. One or both of the rod lamps 30, 30' may also emit an amount of IR radiation or other radiation.

The cover 32 surrounds the rod lamps 30, 30' completely within the flow chamber 22 and isolates the same with respect to fluids in said flow chamber 22. In this respect, the cover 32 may have the same design the cover previously described with respect to FIGS. 1 and 2. Furthermore, it is also possible that further rod lamps are received within the cover 32, which may each emit different radiation or also the same radiation. By the arrangement and the choice of rod lamps 30, 30' a desired radiation profile (with respect to emitted wave length and spatial distribution thereof) may be generated within the flow chamber 22 and beyond the same via the outlet opening of the body 20.

Figure 4:
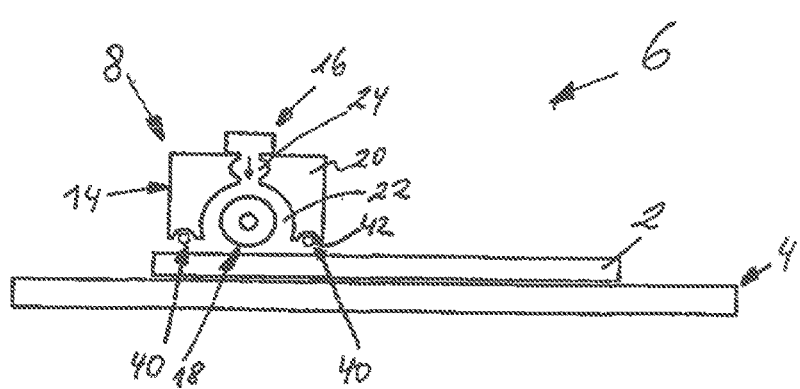
FIG. 4 shows a schematic sectional view similar to FIG. 2 according to a further alternative embodiment of the invention.

FIG. 4 shows a schematic cross-sectional view similar to FIG. 2 of another alternative embodiment of an apparatus 1 for treating substrates 2. When describing this embodiment, the same reference signs will be used as previously, inasmuch as the to same or similar elements are provided.

The apparatus 1 again substantially consists of a substrate holder 4 for receiving a substrate and an application unit 6. The substrate holder 4 may be designed in the same manner as previously described with respect to FIGS. 1 and 2.

The application unit 6 again consists of a main part 8 a support part, which is not shown in FIG. 4, but which may have the same design as one previously described with respect to FIGS. 1 and 2.

The main part 8 again consists substantially of a housing 14, a fluid port 16 and a radiation source 18. Additionally, two further radiation sources 40 are provided. The housing 14 may have a similar design as the one previously described with respect to FIGS. 1 and 2, having an elongated cuboid body 20. A flow chamber 22 and a conduit 24 in the body 20 have the same design as the ones previously described with respect to FIGS. 1 and 2. This is also true with respect to the fluid port 16.

At the bottom side of the body 20, recesses 42 are provided which extend along the length of the body on both sides of the outlet opening. The recesses are dimensioned to at least partially receive the further radiation sources 40. The surfaces of the recesses 42 may have a reflecting surface for the radiation of the radiation sources 40.

The radiation source 18 may have the same design as one design as one described with respect to FIGS. 1 and 2 or it may also have the design described with respect to FIG. 3.

The radiation sources 40 each comprise a rod lamp extending over the length of the body 20, which are received in the respective recesses 42 of the body 20. Even though this is not shown in FIG. 4, the radiation sources 40 may each comprise a cover which is substantially transparent to the radiation of the rod lamp, which cover isolates the rod lamp with respect to the ambient, in particular with respect to any liquids exiting the flow chamber. The rod lamps of the radiation sources 40 may be of the same or a different type and they can also be of a different type to the rod lamps 30, 30' of the radiation source 18. Instead of providing two radiation sources 40, as shown in FIG. 4, it is also possible to provide only one radiation source 40.

Figure 5:
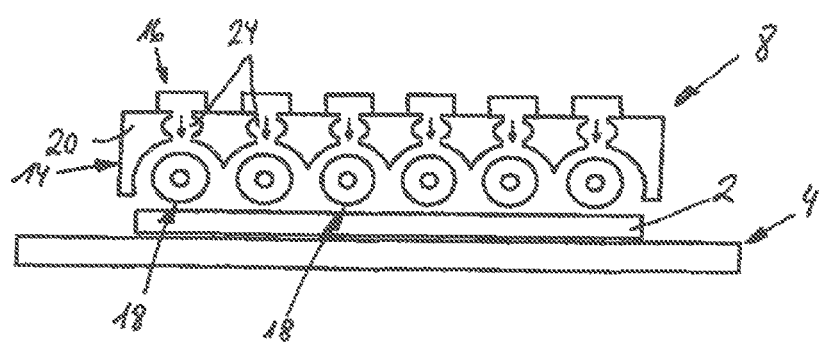
FIG. 5 shows a schematic sectional view similar to FIG. 2 according to yet another embodiment of the invention.

FIG. 5 shows a schematic sectional view similar to FIG. 2 of a further embodiment of an apparatus 1 for treating substrates 2. In the description of this embodiment, again the same reference signs are used as previously, inasmuch as the same or similar elements are provided.

The apparatus 1 again consists substantially of a substrate holder 4, for receiving a substrate and an application unit 6. The substrate holder 4 may be designed in the same manner as previously described with respect to FIGS. 1 and 2.

The application unit 6 again consists of a main part 8 and a support part, which is not shown in FIG. 5. Inasmuch as the main part 8, which will be described here in below is capable of completely covering the substrate, a movability of the support part may be dispensed with. Only a distance adjustment may be required, as well as a movability in order to position the substrate below the main part.

The main part 8 consists in substance of a housing 14, a plurality of fluid ports 16 and a plurality of radiation sources 18. The housing consists of a body 20, which is matched to the shape of the substrate to be treated. In the body 20, a flow chamber 22 is formed, which is open to the bottom side of the body, wherein the opening corresponds in substance to the dimensions of the substrate to be treated. The inner walls of the flow chamber 22 are reflective. The upper side of the flow chamber 22 is connected via a plurality of conduits 24 to a plurality of fluid ports 16 (six are shown here).

A plurality of radiation sources 18 (six are shown here) is provided within the flow chamber 22, which radiation sources extend in a longitudinal or transverse direction through the flow chamber 22. Thus, different flow paths are formed between the walls of the flow chamber 22 and radiation sources 18, as well as between the individual radiation sources. The radiation sources 18 may have the same design as the ones described with respect to FIGS. 1 and 2 or as described with respect to FIG. 3.

Additionally, two further radiation sources 40 are provided. The housing 14 has a similar design as the one previously described with respect to FIGS. 1 and 2, having an elongated cuboid shaped body 20, a flow chamber 22 and a conduit 24 in the body 20 have the same design, as previously described with respect to FIGS. 1 and 2. This is also true for fluid port 16.

The rod lamps described above are each connected to a control unit, which is capable of controlling or driving the rod lamps individually and independently of the others. Rather than using rod lamps it is also possible to use other lamps/radiators which should, however, be capable of providing a substantially homogeneous radiation profile across the length of the flow chamber.

In the following, operation of the apparatus 1 will be described in more detail with respect to the Figures.

For the treatment of a surface of the substrate 2, the main part 8 of the application unit 6 will be moved over a substrate 2 on the substrate holder 4. If the complete surface of the substrate should be treated the main part 8 may be moved during the treatment described here in below across the substrate, unless the embodiment according to FIG. 5 is used, which may completely cover the substrate.

Then, a fluid, in particular a liquid is applied to at least the surfaces of the substrate to be treated via the fluid ports 16, the conduits 24 and the flow chamber 22. Radiation is introduced into said fluid via the first radiation sources 18 and/or the radiation sources 40. The radiation is chosen such that it directly acts on the substrate, in order to treat the same and/or to act on the fluid for changing the characteristics thereof, in order to conduct the desired treatment. In so doing, different treatment possibilities for the surface of the substrate are given, which may be locally limited or may be conducted on the complete surface of the substrate.

In the following, some of these treatment possibilities are explained in more detail without being limited to these examples. The treatment of a photo mask will be given as an example.

First changing of a surface characteristic of a substrate 2 having an at least partially hydrophobic substrate surface to a hydrophilic substrate surface is described. To achieve the same, a liquid such as DI water will be applied as a fluid via the flow chamber 22 onto the substrate surfaces to be treated, in order to form a liquid film on the substrate 2. UV radiation will be introduced into this liquid film via the radiation sources 18 or 40, wherein the liquid and the wave length range of the UV radiation are matched to each other, such that a substantial portion of the UV radiation reaches the interface between the liquid and the substrate surface. The UV radiation now acts to change the previously hydrophobic substrate surface to a hydrophilic surface.

In order to obtain good transmission of the UV radiation through the liquid film, the wave length range of the UV radiation used here is for example above 190 nm. In order to provide such a wave length range, a corresponding rod lamp, which emits in this wave length range, may be controlled or driven, while possibly other lamps are not controlled or driven. When using the cited wave length range one of the following may be used as the liquid: ozone-water, hydrogen-water, DI water or mixtures thereof. Other liquids may also be used.

Next, cleaning of substrate surface will be described which surface was for example treated to have a hydrophilic surface as described above, and which has contaminations, which may be better removed by interaction with radicals.

Here, again, a liquid is applied to the surfaces of the substrate 2 to be cleaned via the flow chamber 22. While the liquid flows around the radiation source 18, UV radiation is emitted into the liquid by the radiation source 18. This radiation causes inter alia the generation of radicals in the liquid. This generation occurs directly before the liquid is applied to the substrate, such that at least a portion of the thus generated radicals, which have a very short decay time contact the substrate 2. Since a radiation of the radiation source 18 is not limited to the flow chamber 22, it is also introduced into a liquid film which is formed by the liquid on the substrate 2 and thus generates further radicals and/or partially maintains the activation of the already generated radicals.

By means of a corresponding movement of the application unit 6, it is possible to selectively clean partial areas or the complete surface of the substrate.

The liquid and the radiation introduced therein are again matched to each other in order to achieve the desired effect. For the generation of radicals, in particular UV radiation in the wave length range of 140 to 280 nm, depending in on the liquid between 140 nm to 200 nm is suited. The UV radiation in the cited wave length range may in particular be matched to the used liquid such that at least 50% of the UV radiation and in particular 80% thereof are absorbed.

Depending on the used liquid, the generation of radicals may also be facilitated by a UV induced decomposition of the liquid, which may occur while the liquid flows around the radiation source 18. For this purpose, the UV radiation should be chosen on the one hand such that a destruction of the molecular structure of the liquid is caused, in order to facilitate a directly following generation of radicals also by means by UV radiation. UV radiation having a wave length above 180 nm is particularly suited for such decomposition. In the embodiment of the radiation source 18 shown in FIG. 3 it could thus be advantageous, if the upper rod lamp is one, which promotes the decomposition, i.e. emits UV light having a wave length above 180 nm, while the lower rod lamp is one, which promotes the generation of radicals, i.e. emits UV light having a wave length between 140 and 280 nm, depending in on the liquid between 140 nm to 200 nm. Taking DI-water as an example, the wavelength range between 140 nm to 200 nm may be suited for the generation of radicals, while for other liquids, a higher range of wavelength between 140 nm to 280 nm may be suited.

These wave length ranges are obviously not binding and may vary depending on the liquid, but are applicable for many of the usually used liquids for cleaning photo masks such as: ozone-water, hydrogen-water, DI water, $H_2O$, $CO_2$—$H_2O$, DI water having $O_2$-gas dissolved therein, $NH_4OH$, organic acids, TMAH, $HNO_3$, HCl, $H_2SO_4$ or mixtures thereof.

Finally, a treatment is described in which ions are to be removed from the surface or near surface layers of the substrate 2, which was for example treated as described above.

For this treatment a liquid, which is heated above ambient temperature is applied via the flow chamber 22 onto the substrate, in order to form a liquid film on at least a partial area of the substrate 2. Radiation is introduced into this liquid film via at least one of the radiation sources 18, 40, wherein the radiation and the liquid are matched to each other, such that at least a portion of the radiation reaches the substrate surface. The electromagnetic radiation causes increased ion mobility, when it hits residual ions on the substrate surface. Furthermore, the radiation, as long as it is absorbed in the liquid may also cause a temperature increase and/or the generation of radicals, which may both promote the removal of ions. In particular, the liquid may be heated directly during the application thereof, for example by means of radiation source having a high IR portion. Inasmuch as an increased temperature of the liquid also increases the solubility of the ions in the liquid, the liquid may be heated up to the boiling point thereof.

As a liquid for example one of the following liquids may be used: ozone-water, hydrogen-water, DI water, $H_2O$, $CO_2$—$H_2O$, DI water having $O_2$-gas dissolved therein, or mixtures thereof. DI water is particularly suited for higher temperatures. As the radiation, in particular UV radiation in the wave length range above 190 nm is suited, which is not so strongly absorbed and which promotes the desired effect of mobilizing and removing ions. IR radiation is also well suited, inasmuch it may provide an in-situ heating of the liquid.

The above treatments may be combined as desired and may be conducted sequentially as described or in part or completely simultaneously.

The invention was described here in above with respect to several embodiments, without being limited to the precise embodiments.

The invention claimed is:

1. An apparatus for treating substrates, said apparatus comprising:
   a substrate holder for receiving the substrate;
   a housing defining a flow chamber having an inlet for a liquid and an outlet opening for the liquid;
   a first radiation source for emitting UV radiation, the first radiation source being at least partially arranged in said outlet opening to emit radiation into said flow chamber and said outlet opening; and
   a unit for generating a relative movement between said substrate holder and said housing, said unit being configured to arrange said housing with respect to said substrate holder such that the outlet opening is directed towards the substrate holder such that a liquid exiting the outlet directly flows onto a substrate on the substrate holder.

2. The apparatus of claim 1, wherein the first radiation source is arranged such that it also emits radiation through said outlet out of the housing.

3. The apparatus of claim 1, wherein the first radiation source is at least partially arranged in said flow chamber.

4. The apparatus of claim 1, wherein said first radiation source is at least partially arranged in said outlet opening.

5. The apparatus of claim 1, wherein the first radiation source is substantially arranged in the middle of the outlet opening.

6. The apparatus of claim 1, wherein the outlet opening and the first radiation source have an extension in length which is greater or at least equal to an extension in width of the substrate to be cleaned.

7. The apparatus of claim 1, wherein the first radiation source comprises a first lamp, which emits radiation in the UV range.

8. The apparatus of claim 7, wherein the first lamp also emits radiation in the IR range.

9. The apparatus of claim 8, wherein the first radiation source comprises at least a second lamp emitting radiation in a primarily different wavelength range than the first lamp.

10. The apparatus of claim 9, wherein at least one cover is provided between the first and/or second lamp and the flow chamber, wherein the at least one cover is substantially transparent to UV radiation.

11. The apparatus of claim 10, wherein the at least one cover completely surrounds the first and/or second lamp in one plane.

12. The apparatus of claim 9, wherein the first and/or second lamp is a rod lamp.

13. The apparatus of claim 9, wherein the first lamp emits UV radiation in the wavelength range between 140 nm to 280 nm.

14. The apparatus of claim 9, wherein the first lamp emits primarily UV radiation in the wavelength range between 140 nm and 280 nm.

15. The apparatus of claim 9, wherein the second lamp emits UV radiation in the wavelength range over 180 nm.

16. The apparatus of claim 9, wherein the second lamp emits IR radiation.

17. The apparatus of claim 9, wherein the second radiation source emits IR radiation.

18. The apparatus of claim 9, further comprising a control unit configured to individually and independently control the first and second radiation units.

19. The apparatus of claim 1, wherein at least one second radiation source is provided outside the flow chamber of the housing such that it emits radiation into an area adjacent to the outlet of the housing.

20. The apparatus of claim 19, wherein the at least one second radiation source emits radiation at a wavelength range that is different than the wavelength range of the first radiation source.

21. The apparatus of claim 19, wherein the at least one second radiation source emits UV radiation at a wavelength range above 180 nm.

22. The apparatus of claim 1, wherein the first radiation source is configured to extend through the outlet opening outside the housing.

* * * * *